United States Patent
Jain et al.

(10) Patent No.: US 7,342,841 B2
(45) Date of Patent: Mar. 11, 2008

(54) METHOD, APPARATUS, AND SYSTEM FOR ACTIVE REFRESH MANAGEMENT

(75) Inventors: Sandeep K. Jain, Milpitas, CA (US); Animesh Mishra, Pleasanton, CA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 11/019,881

(22) Filed: Dec. 21, 2004

(65) Prior Publication Data

US 2006/0133173 A1   Jun. 22, 2006

(51) Int. Cl.
*G11C 7/00* (2006.01)
(52) U.S. Cl. .................. 365/222; 365/230.03; 711/106
(58) Field of Classification Search ................ 365/222, 365/230.03; 711/106
See application file for complete search history.

(56) References Cited

U.S. PATENT DOCUMENTS

| | | | |
|---|---|---|---|
| 5,148,546 A | 9/1992 | Blodgette et al. | |
| 5,469,559 A | 11/1995 | Parks et al. | |
| 5,708,743 A | 1/1998 | DeAndrea et al. | |
| 5,875,143 A | 2/1999 | Ben-Zvi et al. | |
| 6,028,805 A | 2/2000 | Higuchi | |
| 6,094,705 A * | 7/2000 | Song | 711/106 |
| 6,118,719 A * | 9/2000 | Dell et al. | 365/222 |
| 6,206,578 B1 | 3/2001 | Shin et al. | |
| 6,490,216 B1 | 12/2002 | Chen et al. | |
| 6,590,822 B2 * | 7/2003 | Hwang et al. | 365/222 |
| 6,657,920 B2 * | 12/2003 | Lee | 365/236 |
| 6,751,143 B2 * | 6/2004 | Morgan et al. | 365/222 |
| 6,819,617 B2 * | 11/2004 | Hwang et al. | 365/222 |
| 6,876,593 B2 | 4/2005 | Shi et al. | |
| 6,956,782 B2 * | 10/2005 | Hoehler | 365/222 |
| 6,992,943 B2 * | 1/2006 | Hwang et al. | 365/222 |
| 2003/0112688 A1 | 6/2003 | Nakashima et al. | |
| 2003/0138219 A1 | 7/2003 | O'Toole et al. | |
| 2004/0093461 A1* | 5/2004 | Kim | 711/106 |
| 2004/0165465 A1* | 8/2004 | Kashiwazaki | 365/222 |

FOREIGN PATENT DOCUMENTS

| | | |
|---|---|---|
| DE | 199 10 164 | 9/2000 |
| EP | 0 400 176 | 12/1990 |
| EP | 0 917 152 A1 | 5/1999 |
| EP | 1 048 965 | 11/2000 |

* cited by examiner

*Primary Examiner*—Richard T. Elms
*Assistant Examiner*—Eric Wendler
(74) *Attorney, Agent, or Firm*—Kacvinsky LLC

(57) ABSTRACT

A method, apparatus, and system to enable a partial refresh scheme for DRAM which includes specifying at least a refresh start value, or a refresh start value and a refresh end value, to reduce the number of rows that must be refreshed during a refresh cycle, thus reducing the amount of power consumed during refresh.

16 Claims, 5 Drawing Sheets

METHOD, APPARATUS, AND SYSTEM FOR ACTIVE REFRESH MANAGEMENT

BACKGROUND OF THE INVENTION

The present invention relates to Dynamic Random Access Memory (DRAM), and more specifically to DRAM refresh schemes.

In DDR memory systems, a memory controller queues auto-refreshes to the memory device. During normal operation mode, the controller schedules refreshes in bursts to maximize performance. The DRAM maintains an internal refresh counter that tracks bank rows that get refreshed. When each auto-refresh command is received, the DRAM will either increment or decrement the refresh counter.

In an auto-refresh scheme, the memory controller does not know the exact addresses of the memory locations that are being refreshed. Thus, it is difficult to implement a sophisticated refresh management scheme to optimize power vs. performance.

With increased DRAM densities, the number of total pages to be refreshed increases substantially and, as a result, the overall refresh operation consumes an increasing amount of power. Because the controller must refresh all memory locations, whether or not the location is used for data, much power is wasted on unnecessary refresh cycles.

Partial array self refresh (PASR) DRAM is capable of refreshing ¼, ½, or ¾ of a bank of memory. This allows for some reduction in refresh power by reducing the number of memory locations to be refreshed during each refresh cycle. However, PASR DRAM does not allow a refresh start or end location to be specified.

As DRAM densities continue to increase, additional power can be saved by implementing more sophisticated refresh schemes

BRIEF DESCRIPTION OF THE DRAWINGS

A better understanding of the present invention can be obtained from the following detailed description in conjunction with the following drawings, in which.

DETAILED DESCRIPTION

In the following description, for purposes of explanation, numerous details are set forth in order to provide a thorough understanding of embodiments of the present invention. However, it will be apparent to one skilled in the art that these specific details are not required in order to practice the present invention.

Embodiments of the present invention concern a partial refresh scheme for DRAM which includes specifying at least a refresh start value and a fractional portion of memory, or a refresh start value and a refresh end value, to reduce the number of rows that must be refreshed during a refresh cycle, thus reducing the amount of power consumed during refresh. Although the following discussion centers on DRAM devices, it will be understood by those skilled in the art that the present invention as hereinafter claimed may be practiced in support of any type of memory device having cells in need of being refreshed or otherwise maintained at regular intervals in order to preserve their contents. It will also be understood by those skilled in the art that although the following discussion centers on memory devices in which memory cells are organized in two dimensional arrays of rows and columns, the memory cells may be organized in any of a number of ways, including into banks and with or without interleaving, arrays of more than two dimensions, content-addressable memories, etc. In addition, although at least part of the following discussion centers on memory within computer systems, it will be understood by those skilled in the art that the present invention as hereinafter claimed may be practiced in connection with other electronic devices or systems having memory devices.

Figure 1:
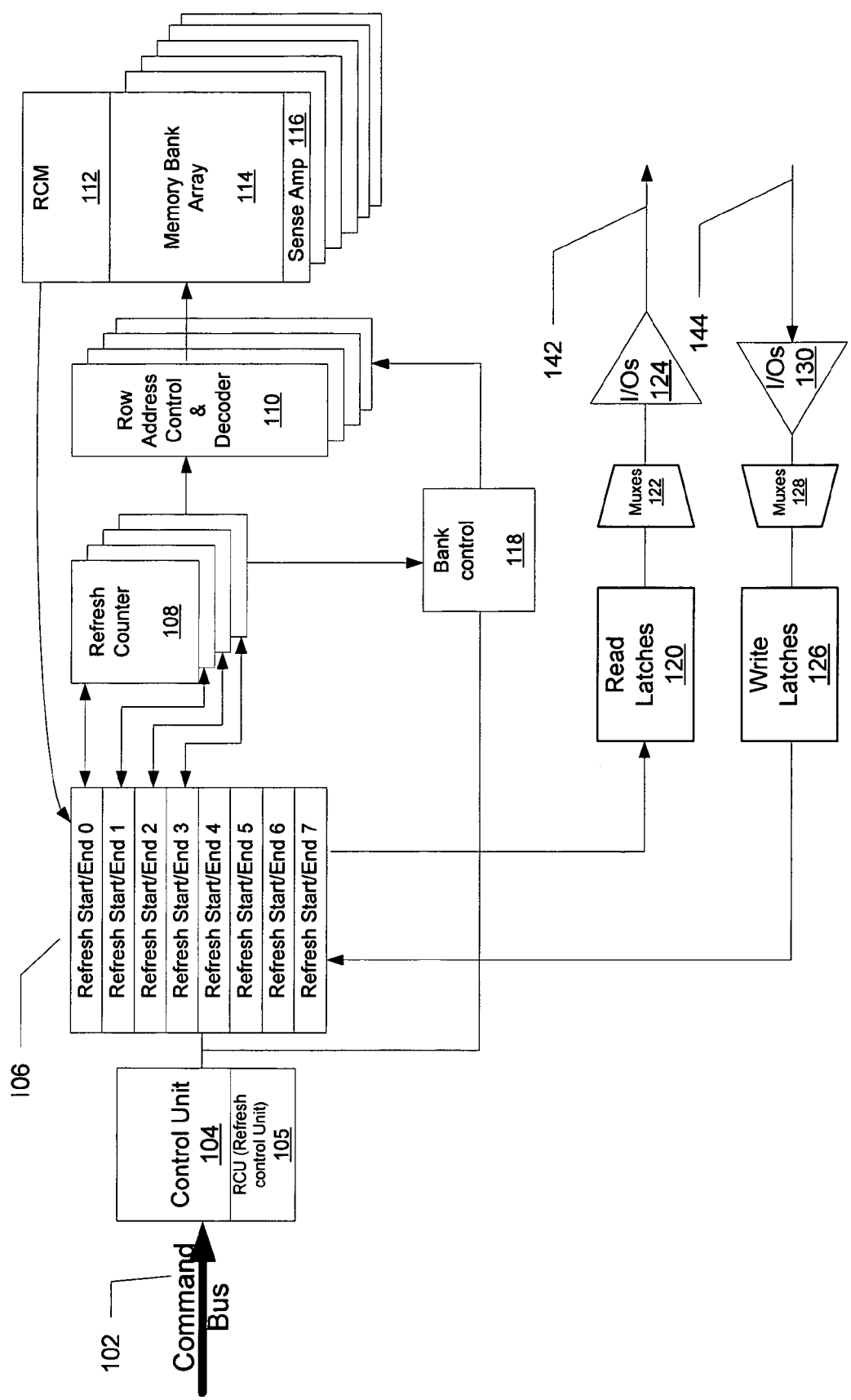
FIG. 1 is an illustration of a block diagram of a memory device according to one embodiment.

FIG. 1 is a simplified block diagram of a memory device according to one embodiment of the present invention. The memory device is made up, at least in part, of control unit (104), which may include a refresh control unit (RCU) (105), one or more refresh start/end registers (106), one or more refresh counters (108), one or more row address control and decoder logic units (110), bank control logic (118), one or more arrays of memory cells arranged in one or more banks of memory (114), which may include an area of memory to store refresh start/end registers (112), sense amplifiers (116), read latches (120), multiplexers (122, 128), I/O buffers (124, 130), and write latches (126). The memory device also includes several external interfaces, including but not limited to an external control interface, or command bus (102), and an interface for reading from or writing to the refresh start/end registers (142, 144). The exact arrangement and configuration of components within the memory device may be reduced, augmented, or otherwise altered without departing from the spirit and scope of the present invention.

Refresh start/end registers (106) may store refresh values, including refresh start and/or refresh end values. The refresh values stored in each refresh start/end register indicate a contiguous block of memory in a memory bank array (114) that is to be refreshed during a refresh cycle. For example, a refresh start value may indicate an address in memory where a refresh operation will begin. A refresh end value may indicate an address in memory where a refresh operation will end. Alternately, a refresh end value may indicate a number of rows in memory that are to be refreshed during a refresh cycle.

Each refresh start/end register (106) may correspond to one memory bank array (114). For example, in an eight bank memory system, there may be eight refresh start/end registers, or one refresh start/end register per bank.

In one embodiment, partial array self refresh (PASR) DRAM may include readable and writable data storage elements, such as refresh start/end registers (106) which store only refresh start values. In this embodiment, the refresh start value indicates the address in memory where a refresh operation will begin. The end location for the refresh may be determined based on the fractional portion of memory that is to be refreshed during a partial refresh. For example, when a refresh start location is specified and ½ bank refresh is selected in the PASR DRAM, the refresh cycle will begin at the specified location and continue until ½ of the bank of memory has been refreshed.

The refresh start/end registers (106) are readable and writable data storage elements. The refresh start/end registers may be implemented as mode registers in a DRAM, or may be stored in volatile or non-volatile memory, such as refresh counter memory (RCM) (112), protected memory, or other non-accessible memory.

The refresh start/end registers may be written to by an external device (not shown) or by control unit (104). Refresh values may be programmed by an external device over a bus (144). The refresh values are received at I/O buffers (130), which are coupled to multiplexers (128) and write latches (126). The write latches are coupled to the refresh start/end registers (106). The values in the refresh start/end registers (106) are set based upon the data received at the I/O buffers (130).

In one embodiment, refresh values may be written to the refresh start/end registers (106) over an address bus. In this embodiment, the refresh values may be stored on a per-bank basis over the address bus. For example, both a refresh value and a bank may be specified when programming the refresh start/end registers.

In another embodiment, refresh values for all banks may be programmed in the refresh start/end registers (106) over a data bus. In this embodiment, the refresh values to be stored in each of the refresh start/end registers may be sent over the data bus in one burst write operation. The data write path may be optimized for timing.

After the refresh values have been programmed into the refresh start/end registers (106), the refresh start value from the refresh start/end register may be placed in a refresh counter (108). The refresh counter indicates the address of the next row that is to be refreshed during a refresh cycle. Thus, the next row to be refreshed will be the row having the address indicated by the start refresh value. Furthermore, when the next refresh cycled is initiated by the refresh control unit (105), the refresh will begin at the memory location indicated by the refresh start value.

After each row is refreshed, the refresh counter may be incremented or decremented, until the refresh end value is reached. When the refresh end value is reached, or, for PASR DRAM, when a predetermined fractional amount of the memory block (e.g. ¼, ½, ¾, etc.) has been refreshed, the refresh cycle is complete. In this manner, a contiguous block of memory beginning and ending at a predetermined location may be refreshed in one or more banks of memory.

The refresh start/end registers (106) are readable as well. In one embodiment, when a command to read a refresh start/end register is issued, the current refresh counter value is placed in the refresh start/end register before it is read. This allows access to the address of the next row that is to be refreshed. In another embodiment, no new value is placed in the refresh start/end register, and the initial refresh value that was written to the refresh start/end register may be read from the refresh start/end register.

The refresh values may be read from the refresh start/end register over a bus (142). Bus (142) may be an address bus or a data bus. In the case where bus (142) is an address bus, the address bus must be a bidirectional bus. Where bus (142) is a data bus, the refresh values may be multiplexed on the read data path to optimize the read timing path.

Figure 2:
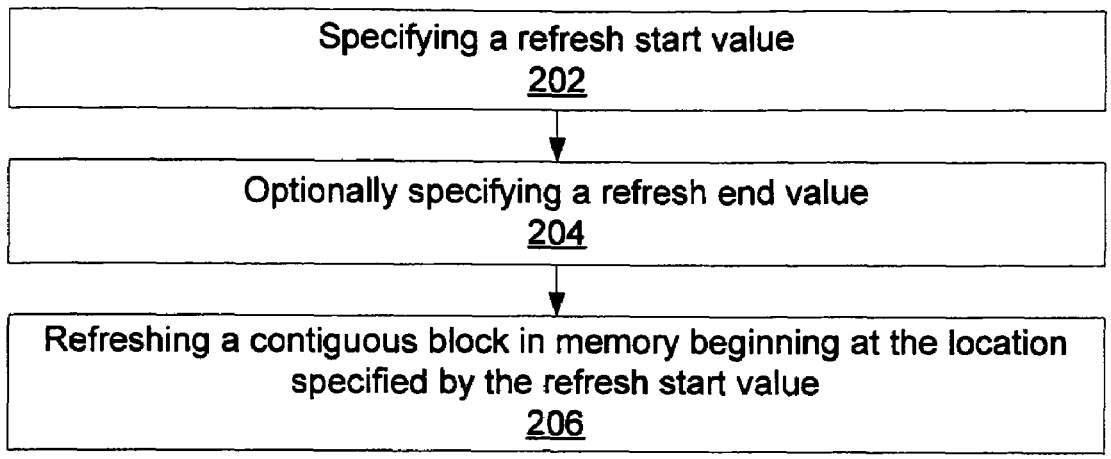
FIG. 2 is a flow diagram illustrating a method according to one embodiment.
Figure 3:
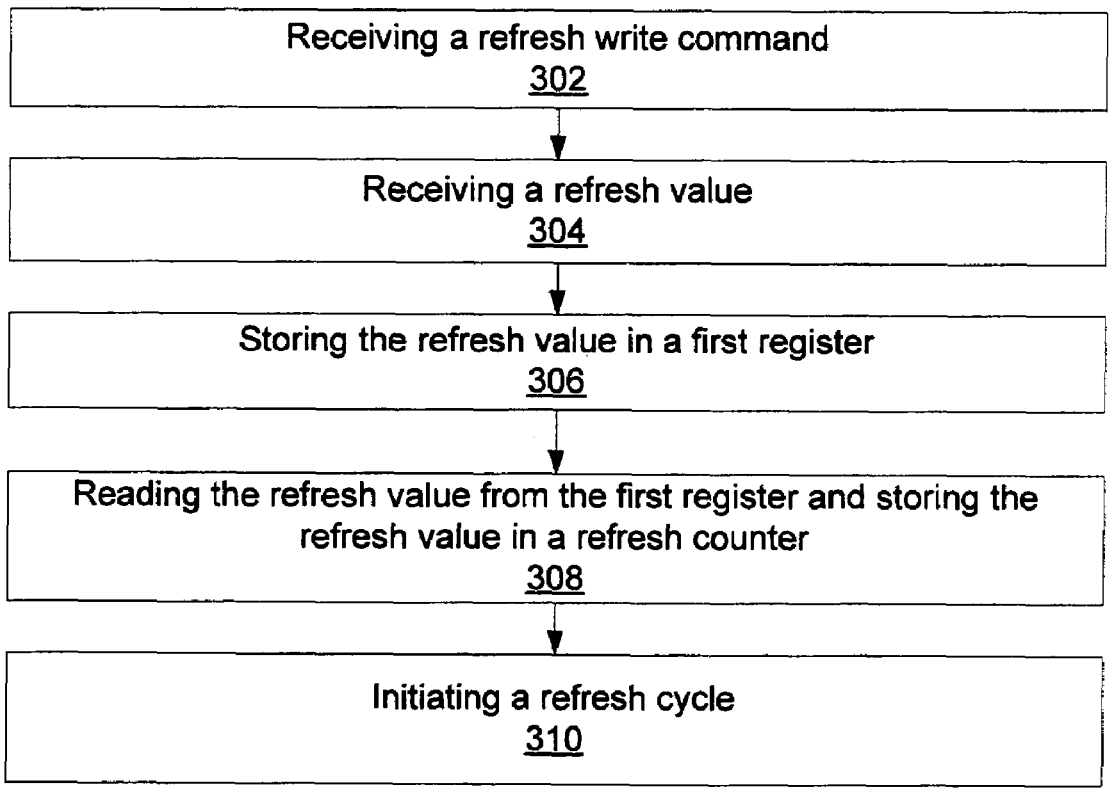
FIG. 3 is a flow diagram illustrating a method according to one embodiment.
Figure 4:
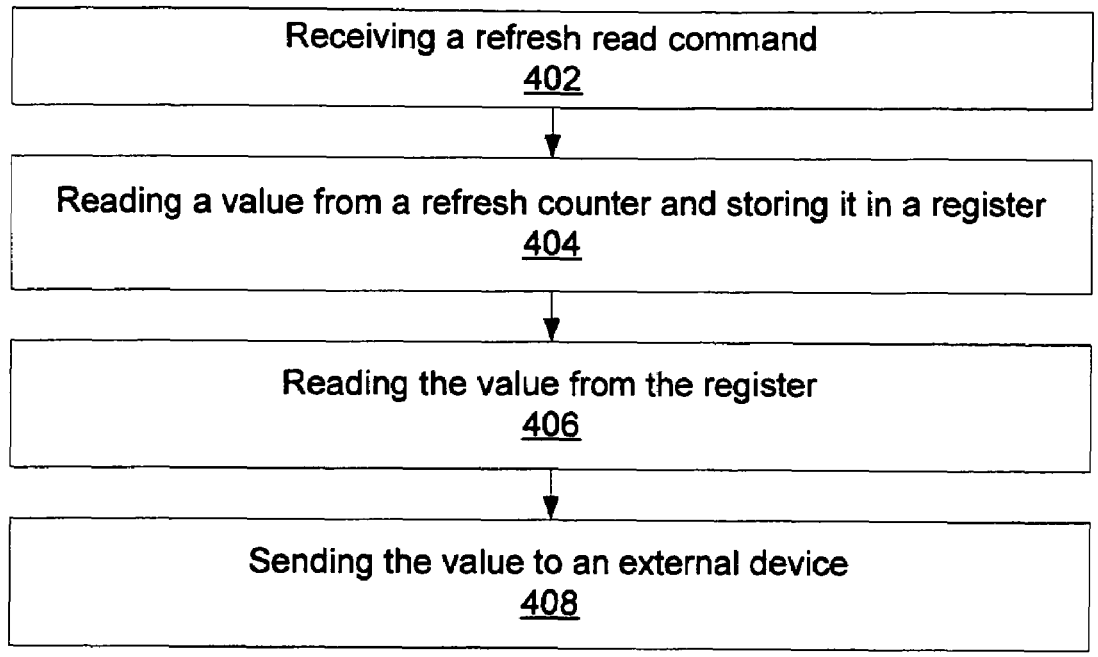
FIG. 4 is a flow diagram illustrating a method according to one embodiment.

FIGS. 2 through 4 are flowcharts illustrating methods according embodiments of the present invention. Although the following operations may be described as a sequential process, some of the operations may be performed in parallel or concurrently. In addition, the order of the operations may be re-arranged without departing from the spirit of embodiments of the invention.

FIG. 2 is a flowchart which illustrates one embodiment of a method by which a specified portion of memory may be refreshed. First, as illustrated in block 202, a refresh start value is specified. Next, as illustrated in block 204, a refresh end value may optionally be specified. In embodiments of the present invention, the refresh start and end values may be stored in mode registers inside a DRAM, or may be stored in memory. Refresh start and end values may be specified for each memory bank within the DRAM. Finally, as illustrated in block 206, a contiguous block in memory is refreshed, beginning at the location specified by the refresh start value, and optionally ending at the location specified by the refresh end value.

FIG. 3 is a flowchart which illustrates one embodiment of a method by which a refresh start value and/or a refresh end value may be written to a memory device by an external device. A refresh write command is received by a memory device, as shown by block 302. The refresh write command may be issued to the memory device by a memory controller or by another device, and may be sent over a command bus.

Next, a refresh value is received by the memory device, as shown by block 304. The refresh value may include only a refresh start value, only a refresh end value, or both refresh start and end values. The refresh value may be sent to the memory device by a controller or by another device. In one embodiment, the refresh values may be programmed over an address bus. In this embodiment, it may be possible to specify a bank which corresponds to the refresh value. In another embodiment, the refresh values may be sent over a data bus. The refresh values for all banks may be sent in one burst write operation.

The received refresh value is stored in a register, as illustrated in block 306. The register may be a mode register, or another register in the memory device. In one embodiment, the received refresh value may alternately be stored in a reserved memory location.

The refresh value may then be read from the register and stored in a refresh counter, as shown by block 308. The refresh counter contains the location of the next row in memory to be refreshed.

Finally, a refresh cycle is initiated as shown in block 310. When a refresh cycle is initiated by the refresh control unit, the first row to be refreshed is indicated by the value in the refresh counter, which is the refresh start value. In one embodiment, the refresh cycle continues until the refresh end value is reached, or until a predetermined portion of memory, e.g. ½ or ¼, has been refreshed.

FIG. 4 is a flowchart which illustrates one embodiment of a method by which an external device, such as a memory controller device, may read the values of the refresh start value and/or the refresh end value from a memory device. A refresh read command is received by a memory device, as shown by block 402. The refresh read command may be issued to the memory device by a memory controller or by another device, and may be sent over a command bus.

Next, a value is read from the refresh counter, as shown by block 404. The value read from the refresh counter indicates the next location in memory that is to be refreshed during a memory refresh cycle. The value from the refresh counter may be stored in a register. In one embodiment, the value from the refresh counter may be stored in the refresh start/end register. The value may be stored in another register as well, or may be stored in a location in memory.

The value is then read from the register as illustrated by block 406. Finally, the value may be sent to an external device, as illustrated by block 408. In one embodiment, the value may be sent to a memory controller device over a data bus or over an address bus.

Figure 5:
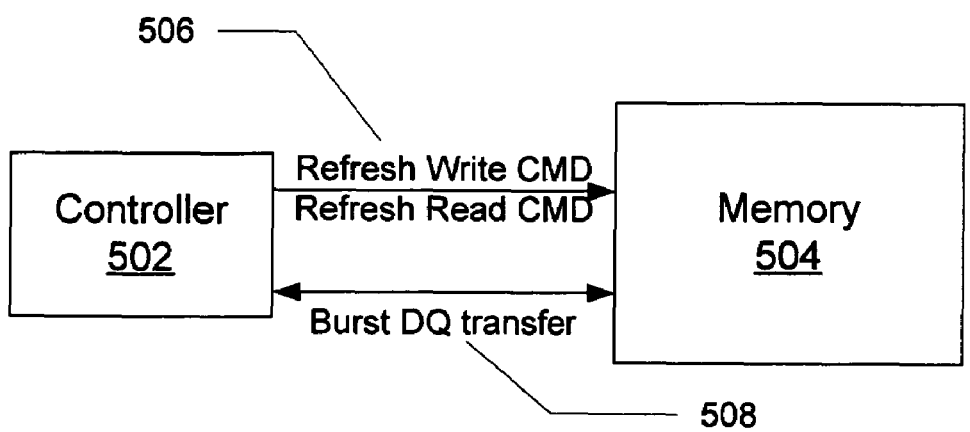
FIG. 5 is an illustration of a block diagram of a memory device coupled to a memory controller device according to one embodiment.

FIG. 5 is a block diagram which illustrates the interconnection between a memory device and a controller device according to one embodiment of the present invention. Memory controller device (502) is coupled to memory device (504). The memory controller device (502) may issue refresh write and/or refresh read commands, as described above in conjunction with FIGS. 3-4. The refresh read and refresh write commands are issued by the memory controller device (502) and sent to the memory device (504) on a command bus (506).

Upon issuance of a refresh write command, refresh values may be sent from the memory controller device (502) to the memory device (504) in a burst data transfer over a data bus (508). Upon issuance of a refresh read command, refresh values may be sent from the memory device (504) to the memory controller device (502) in a burst data transfer over a data bus (508).

Figure 6:
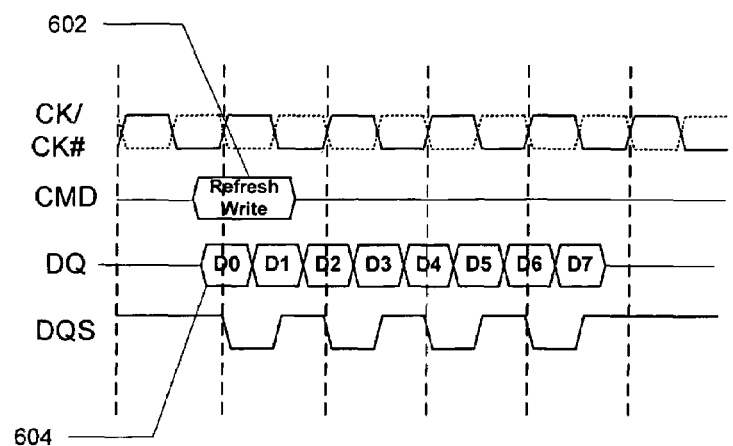
FIG. 6 is a timing diagram according to one embodiment.

FIG. 6 is a timing diagram illustrating a refresh write command according to one embodiment. The memory device receives a refresh write command (602), followed by a burst data transfer (604) of the refresh values (D0:7). The refresh values are latched on the rising and falling edges of the data strobe (DQS).

Figure 7:
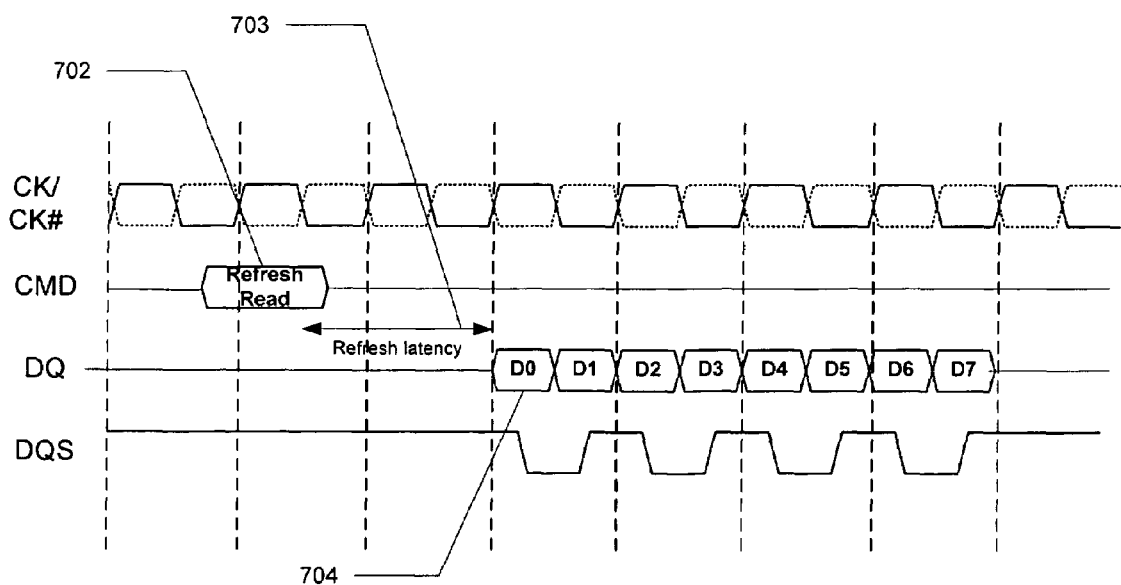
FIG. 7 is a timing diagram according to one embodiment.

FIG. 7 is a timing diagram illustrating a refresh read command according to one embodiment. The memory device receives a refresh read command (702). After a refresh latency period (703), refresh values (704) may be sent on the data bus.

Figure 8:
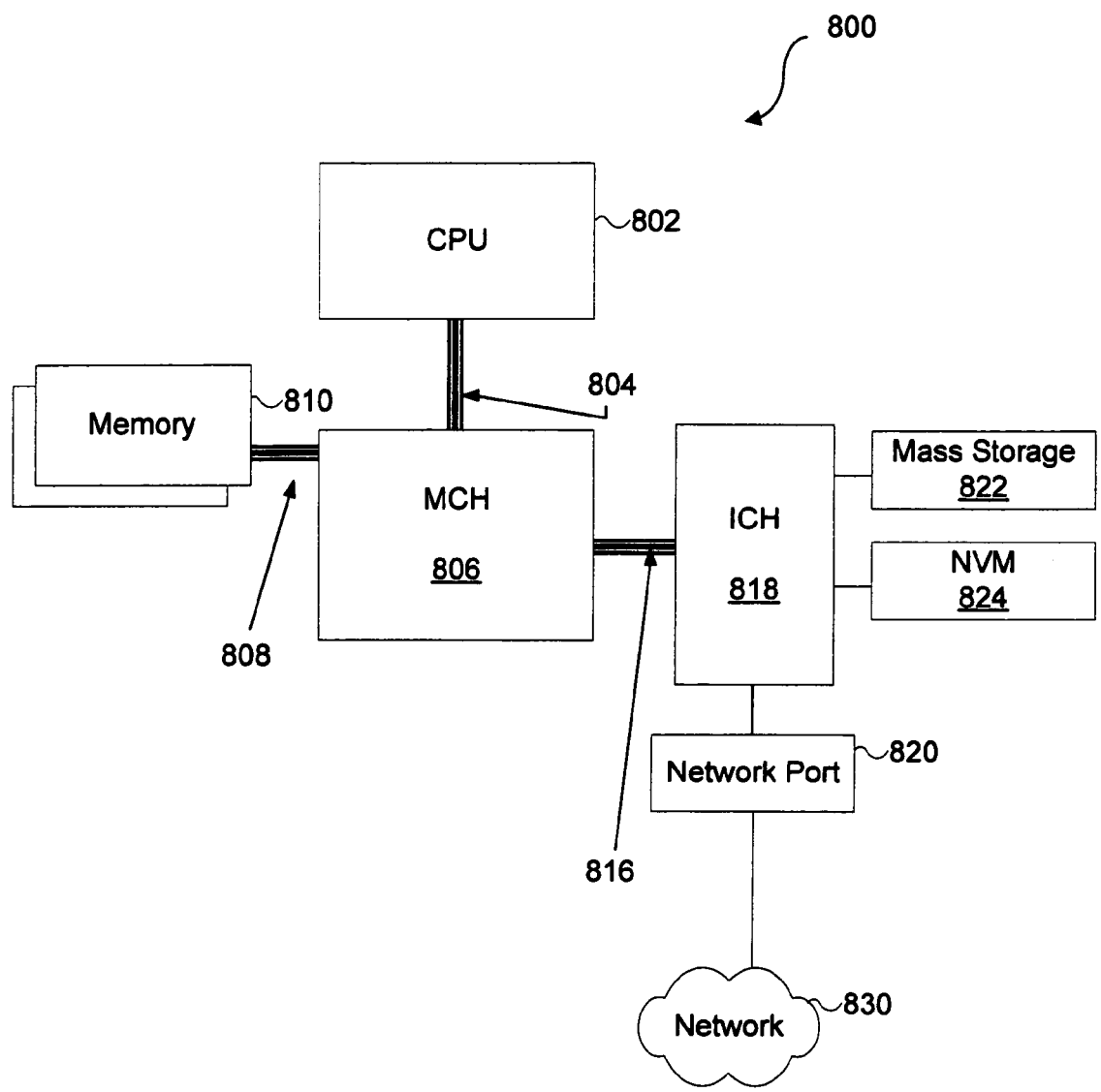
FIG. 8 is a system block diagram according to one embodiment.

FIG. 8 illustrates one embodiment of a system according to the present invention. The system (800) includes at least a processor or CPU (802), memory controller device (806), I/O controller device (818), and one or more memory devices (810). A block diagram of memory device (810) is illustrated in FIG. 1.

The system may also include a network port or interface (820), and may be coupled to a wired or wireless network (830). The memory controller device (806) is coupled to the CPU (802) by a bus (804). The memory controller device (806) provides the CPU (802) with access to one or more memory devices (810), to which the memory controller device (806) is coupled by a memory bus (808). An I/O controller hub (818) may be coupled to the memory controller device (806) by a bus (816). The I/O controller hub (818) may be coupled to a network port (820), capable of connecting to a network (830). The I/O controller hub (818) may also be coupled to a mass storage device (822) and non-volatile memory (824).

Together, these components form a system (800) that is capable of supporting the execution of machine readable instructions by CPU (802), and the storage of data, including instructions, within memory devices (810). During operation of the system, the CPU (802) may execute instructions causing refresh start values and/or refresh end values to be written to one or more memory devices (810). As a result, when a refresh cycle for a memory device is initiated, the refresh cycle may begin at the location in memory specified by the refresh start value, and may end at the location specified by the refresh end value, thereby refreshing only a predetermined portion of rows in the memory device. The CPU (802) may also execute instructions causing the refresh start values and/or the refresh end values to be read from one or more memory devices.

In embodiments of the present invention, the specific components within the system (800) may vary. For example, the CPU (802) may be any one of a variety of types of CPU, memory devices (810) could be any of a variety of types of memory, including DRAM or another type of memory that requires refresh, and memory controller device (806) may be any device with an appropriate interface for the memory devices (810). Embodiments of the system may also include additional devices which are not illustrated in FIG. 8, including but not limited a graphics controller device and I/O devices.

Thus, a method, apparatus, and system for active refresh management are disclosed. In the above description, numerous specific details are set forth. However, it is understood that embodiments may be practiced without these specific details. In other instances, well-known circuits, structures and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. A memory device comprising:
    an array of memory cells; and
    at least one readable and writable refresh start/end data storage element to store a refresh start value indicating a specific point within the array of memory cells for starting a refresh operation.

2. The memory device of claim 1, wherein the at least one readable and writable refresh start/end data storage element is further to store a refresh end value indicating a specific point within the array of memory cells for ending a refresh operation.

3. The memory device of claim 1, wherein the array of memory cells is arranged in one or more banks.

4. The memory device of claim 2, wherein the refresh start value is an address corresponding to a location in memory where a refresh cycle begins.

5. The memory device of claim 3, wherein each bank corresponds to one refresh start/end data storage element.

6. The memory device of claim 4, wherein the refresh end value is an address corresponding to a location in memory where the refresh cycle ends.

7. The memory device of claim 4, wherein the refresh end value is a number corresponding to a number of locations in memory that are to be refreshed during a refresh cycle.

8. A system comprising:
    a processor;
    a memory controller device coupled to the processor, the memory controller device capable of sending a refresh start address and a refresh end address; and
    a memory device coupled to the memory controller device, the memory device capable of receiving and storing the refresh start address and the refresh end address.

9. The system of claim 8, wherein the memory device is further capable of contiguously refreshing memory locations between the refresh start address and the refresh end address.

10. The system of claim 8, wherein the memory device is capable of receiving the refresh start address and the refresh end address over a data bus.

11. The system of claim 8, wherein the memory device is capable of receiving the refresh start address and the refresh end address over an address bus.

12. The system of claim 9, wherein the memory device is a DRAM memory device.

13. The system of claim 9, wherein the memory device is a DDR memory device.

14. A memory device comprising:
an array of memory cells;
at least one readable and writable data storage element to store a refresh start address indicating a specific point within the array of memory cells for starting a refresh operation; and
at least one readable and writable data storage element to store a refresh end address indicating a specific point within the array of memory cells for ending a refresh operation.

15. The memory device of claim 14, wherein the array of memory cells is arranged in one or more banks.

16. The memory device of claim 15, wherein each bank corresponds to a readable and writable data storage element to store a start refresh address and a readable and writable data storage element to store an end refresh address.

* * * * *